(12) United States Patent
Uetani et al.

(10) Patent No.: US 7,982,367 B2
(45) Date of Patent: Jul. 19, 2011

(54) PIEZOELECTRIC/ELECTROSTRICTIVE ELEMENT HAVING A MULTILAYER EXTERNAL ELECTRODE STRUCTURE AND METHOD FOR MANUFACTURING THEREOF

(75) Inventors: Masayuki Uetani, Kasugai (JP); Haruhiko Ito, Komaki (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 12/879,282

(22) Filed: Sep. 10, 2010

(65) Prior Publication Data
US 2010/0327703 A1 Dec. 30, 2010

Related U.S. Application Data

(63) Continuation of application No. PCT/JP2009/055218, filed on Mar. 11, 2009.

(30) Foreign Application Priority Data

Mar. 21, 2008 (JP) ................................. 2008-074004

(51) Int. Cl.
*H01L 41/083* (2006.01)
(52) U.S. Cl. ........ 310/328; 310/363; 310/364; 310/365; 310/366
(58) Field of Classification Search .................. 310/328, 310/363–366
See application file for complete search history.

(56) References Cited

U.S. PATENT DOCUMENTS

| 6,989,627 | B2 * | 1/2006 | Senoo et al. | 310/363 |
| 7,339,310 | B2 * | 3/2008 | Kobane et al. | 310/366 |
| 2007/0176521 | A1 | 8/2007 | Nakamura | |
| 2007/0273251 | A1 | 11/2007 | Okamura et al. | |

FOREIGN PATENT DOCUMENTS

| JP | 02-164085 | A1 | | 6/1990 |
| JP | 10-172855 | A1 | | 6/1998 |
| JP | 11-121820 | A1 | | 4/1999 |
| JP | 11121820 | A | * | 4/1999 |
| JP | 2002-246258 | A1 | | 8/2002 |
| JP | 2002-289932 | A1 | | 10/2002 |
| JP | 2003258328 | A | * | 9/2003 |
| JP | 2003318458 | A | * | 11/2003 |
| JP | 2005-183607 | A1 | | 7/2005 |
| JP | 2006-073672 | A1 | | 3/2006 |
| JP | 2006156587 | A | * | 6/2006 |
| JP | 2007096052 | A | * | 4/2007 |
| JP | 2007243066 | A | * | 9/2007 |
| JP | 2008-053467 | A1 | | 3/2008 |

* cited by examiner

*Primary Examiner* — J. SanMartin
(74) *Attorney, Agent, or Firm* — Burr & Brown

(57) ABSTRACT

Disclosed is a piezoelectric/electrostrictive element equipped with a piezoelectric/electrostrictive drive unit having a piezoelectric/electrostrictive body, and a film external terminal electrode containing substantially no glass component and being disposed on at least one surface of the piezoelectric/electrostrictive body. The external terminal electrode is an electrode having a laminated structure equipped with a first electrode layer made of a first electrode material being disposed to contact the piezoelectric/electrostrictive body closely and containing a first metal component and a piezoelectric/electrostrictive material, and a second electrode layer made of a second electrode material containing a second metal component and substantially no piezoelectric/electrostrictive material, which the first and second metal components are in the same element system.

13 Claims, 11 Drawing Sheets

PIEZOELECTRIC/ELECTROSTRICTIVE ELEMENT HAVING A MULTILAYER EXTERNAL ELECTRODE STRUCTURE AND METHOD FOR MANUFACTURING THEREOF

FIELD OF THE INVENTION

The present invention relates to a piezoelectric/electrostrictive element suitable as an ultrasonic motor or the like, and a method for manufacturing thereof.

BACKGROUND OF THE INVENTION

A laminated type piezoelectric/electrostrictive element conventionally manufactured by use of a piezoelectric/electrostrictive material (hereinafter referred to also as a piezoelectric/electrostrictive porcelain composition, a piezoelectric/electrostrictive ceramics or the like) has been utilized for electronic products such as a piezoelectric actuator, a filter, a piezoelectric resonator (including an oscillator), an ultrasonic vibrator, an ultrasonic motor and a piezoelectric sensor since the element has a very high response speed in an electric signal.

As a related conventional technology, in Patent Document 1, there is disclosed a laminated type piezoelectric actuator having been obtainable an insulator, external electrodes and lead wires on a fired body produced by firing a laminate produced by laminating alternately green sheets containing a piezoelectric ceramic material as a main component and internal electrodes. It is to be noted that the internal electrodes of the piezoelectric actuator disclosed in Patent Document 1 contain a silver-palladium alloy material and the piezoelectric ceramic material at predetermined ratios, to prevent the internal electrodes from being peeled from the green sheets.

Also in Patent Documents 2 and 3, similarly from the viewpoint of the prevention of peeling from a dielectric layer (a piezoelectric ceramic layer), there are disclosed a laminated chip part in which internal electrode layers containing almost the same ceramic powder as that of dielectric layers are used, and a laminated piezoelectric body in which a laminated body obtained by laminating a plurality of piezoelectric ceramic layers is provided with electrode layers made of a silver-palladium alloy containing silver at a predetermined ratio, respectively.

Heretofore, there has been such a known technique in which an electrode material is blended with a piezoelectric/electrostrictive material to improve adhesion between piezoelectric/electrostrictive bodies and electrodes.

Conventionally, external terminal electrodes of a laminated type piezoelectric/electrostrictive element has been disposed on the surface of the piezoelectric/electrostrictive body (externally) by applying an electrode material containing a glass component and the like on the surface of the fired piezoelectric/electrostrictive body, and subsequently firing the resultant. That is, to manufacture the laminated type piezoelectric/electrostrictive element including the external terminal electrodes, the firing is performed at least twice, i.e., firing the piezoelectric/electrostrictive body and firing the external terminal electrodes.

Patent Document 1: JP-A-H11-121820
Patent Document 2: JP-A-H10-172855
Patent Document 3: JP-A-2006-73672

SUMMARY OF THE INVENTION

To decrease the number of firing times and simplify manufacturing steps, for example, a cermet paste is applied onto an unfired piezoelectric/electrostrictive body (a piezoelectric/electrostrictive precursor), and then the piezoelectric/electrostrictive body and external terminal electrodes are simultaneously fired in a lump. In this case, a piezoelectric/electrostrictive material contained in the cermet paste is deposited on the surface of the formed external terminal electrodes sometimes. The deposited piezoelectric/electrostrictive material is usually an insulator, and hence the conducting performance of the external terminal electrodes may become insufficient. Furthermore, when electric characteristics of a product having such an external terminal electrodes are evaluated, it has been sometimes judged that the measurement of the conductivity is not possible due to difficulty in acquiring the conductivity.

On the other hand, in a case where an electrode material which does not contain the piezoelectric/electrostrictive material is used on the piezoelectric/electrostrictive precursor to avoid the deposition of the piezoelectric/electrostrictive material on the surface of the external terminal electrode, adhesion of the formed external terminal electrode and the piezoelectric/electrostrictive body becomes insufficient, thereby causing a problem where the external terminal electrode easily peels from the piezoelectric/electrostrictive body during or after firing. Moreover, in a case where a material containing an added glass component is used as an external terminal electrode material to avoid the peeling of the external terminal electrodes from the piezoelectric/electrostrictive body, when the piezoelectric/electrostrictive body and the external terminal electrodes are formed by simultaneous firing, a piezoelectric/electrostrictive porcelain composition reacts with a glass component, and the composition of the piezoelectric/electrostrictive porcelain composition fluctuates, thereby causing a problem where the characteristics of the obtained piezoelectric/electrostrictive body are deteriorated.

The present invention has been developed in view of such problems of a conventional technology, and an object thereof is to provide an inexpensively manufacturable piezoelectric/electrostrictive element possessing the external terminal electrodes excellent in the conducting performance, which is satisfactorily adhered tightly to a piezoelectric/electrostrictive body and does not peel easily therefrom, and a manufacturing method thereof.

The present inventors have intensively performed investigations for attaining the above object, and have eventually found that the above object can be attained by employing, as an external electrode structure, a laminated structure comprising a first electrode layer made of a first electrode material containing a piezoelectric/electrostrictive material and a second electrode layer made of a second electrode material which substantially does not contain the piezoelectric/electrostrictive material, to complete the present invention.

That is, according to the present invention, there are provided a piezoelectric/electrostrictive element and a method for manufacturing thereof as follows.

[1] A piezoelectric/electrostrictive element comprising: a piezoelectric/electrostrictive drive unit possessing a piezoelectric/electrostrictive body made of a piezoelectric/electrostrictive material; and a film external terminal electrode which is disposed on at least one surface of the piezoelectric/electrostrictive body and which substantially does not contain a glass component, wherein the external terminal electrode is an electrode having a laminated structure comprising a first electrode layer disposed to contact the piezoelectric/electrostrictive body closely and made of a first electrode material which contains a first metal component as well as the piezoelectric/electrostrictive material and a second electrode layer disposed on the first electrode layer and made of a second electrode material which contains a second metal component and substantially does not contain the piezoelectric/electrostrictive material, and the first metal component and the second metal component are in the same element system.

[2] The piezoelectric/electrostrictive element according to the above [1], wherein the arrangement region of the second electrode layer is smaller than that of the first electrode layer.

[3] The piezoelectric/electrostrictive element according to the above [1] or [2], wherein the piezoelectric/electrostrictive drive unit further possesses internal electrodes made of an electrode material for the internal electrodes, and is a laminated body in which the piezoelectric/electrostrictive body and the internal electrodes are alternately laminated, and wherein the electrode material for the internal electrodes contains a third metal component in the same element system as that of the first and second metal components.

[4] The piezoelectric/electrostrictive element according to the above [3], wherein the piezoelectric/electrostrictive drive unit is a columnar laminated body, and further possesses side electrodes disposed on the side surfaces of the drive unit to electrically connect the external terminal electrodes to the internal electrodes.

[5] The piezoelectric/electrostrictive element according to any one of the above [1] to [4], wherein the piezoelectric/electrostrictive material is a lead-zirconate-titanate-based piezoelectric/electrostrictive porcelain composition.

[6] The piezoelectric/electrostrictive element according to the above [5], wherein the piezoelectric/electrostrictive porcelain composition contains 65 to 70 mass % of Pb in terms of PbO, 7.0 to 16.0 mass % of Ti in terms of $TiO_2$, 10.5 to 24.5 mass % of Zr in terms of $ZrO_2$, 0.65 to 1.05 mass % of Sb in terms of $Sb_2O_3$, 0.5 to 0.8 mass % of Nb in terms of $Nb_2O_5$, 0.3 to 0.7 mass % of Cu in terms of CuO, 0.6 to 1.5 mass % of W in terms of $WO_3$ and 0.3 to 0.7 mass % of Mn in terms of $MnO_2$, and a molar content ratio between Cu and W is in a range of 1.5:1 to 2.5:1.

[7] The piezoelectric/electrostrictive element according to any one of the above [1] to [6], wherein the first metal component and the second metal component contain Ag, Pd, Pt, Au or an alloy of them as a main component.

[8] The piezoelectric/electrostrictive element according to the above [7], wherein the first metal component contains 60 to 90 mass % of Ag and 10 to 40 mass % of Pd (with the proviso that Ag+Pd=100 mass %), and the content ratio of the piezoelectric/electrostrictive material with respect to the total of the first metal component and the piezoelectric/electrostrictive material is in a range of 10 to 50 vol %.

[9] The piezoelectric/electrostrictive element according to the above [7] or [8], wherein the second metal component contains 60 to 90 mass % of Ag and 10 to 40 mass % of Pd (with the proviso that Ag+Pd=100 mass %).

[10] A method for manufacturing the piezoelectric/electrostrictive element according to any one of the above [1] to [9], comprising: a step of disposing, on the surface of a piezoelectric/electrostrictive precursor, a first electrode material containing a first metal component and a piezoelectric/electrostrictive material in the form of a film to form a first electrode layer precursor; a step of disposing, on the first electrode layer precursor, a second electrode material which contains a second metal component in the same element system as that of the first metal component and which substantially does not contain the piezoelectric/electrostrictive material in the form of a film to form a second electrode layer precursor; and a step of integrally firing the piezoelectric/electrostrictive precursor, the first electrode layer precursor and the second electrode layer precursor to dispose, on the surface of a piezoelectric/electrostrictive body, a film external terminal electrode which has a laminated structure comprising a first electrode layer disposed to contact the piezoelectric/electrostrictive body closely and a second electrode layer disposed on the first electrode layer and which substantially does not contain a glass component.

The piezoelectric/electrostrictive element according to the present invention shows such an effect that the piezoelectric/electrostrictive element possesses the external terminal electrodes excellent in the conducting performance, which adhere to the piezoelectric/electrostrictive body in such a satisfactory state so that they do not easily peel from the piezoelectric/electrostrictive body, and is producible at a low price.

Moreover, according to the present inventive method for manufacturing a piezoelectric/electrostrictive element can show such an effect that it is possible to simply and inexpensively manufacture the piezoelectric/electrostrictive element possessing the external terminal electrode excellent in the conducting performance, which does not easily peel from the piezoelectric/electrostrictive body, and adheres tightly thereto.

Figure 1:
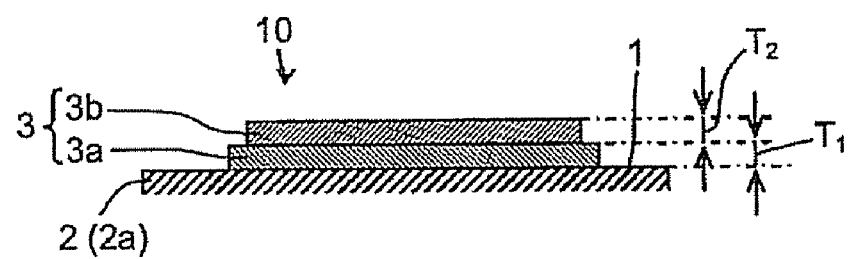
FIG. 1 is a partially sectional view schematically showing one embodiment of a piezoelectric/electrostrictive element of the present invention.

DESCRIPTION OF REFERENCE NUMERALS 1, 11, 21 and 31: piezoelectric/electrostrictive drive unit, 2, 12 and 22: piezoelectric/electrostrictive body, 2a: uppermost layer piezoelectric/electrostrictive body, 3, 13, 23, 33, 43, 53, 63 and 73: external terminal electrode, 3a, 6a, 13a, 33a, 43a, 53a, 63a and 73a: first electrode layer, 3b, 6b, 13b, 33b, 43b, 53b, 63b and 73b: second electrode layer, 4: laminated substrate, 5: product portion, 6 and 16: side electrode, 7a: internal electrode, 10, 20, 30 and 40: piezoelectric/electrostrictive element, 11a, 11c and 11d: board element, 17: common internal electrode, D: dimensional difference between arrangement region of first electrode layer and arrangement region of second electrode layer, $D_1$: diameter of piezoelectric/electrostrictive element, $H_1$: height of laminated substrate, $H_2$, $H_3$ and $H_4$: height of piezoelectric/electrostrictive element, $L_1$: length of laminated substrate, $L_2$ and $L_3$: length of piezoelectric/electrostrictive element, $T_1$: thickness of first electrode layer, $T_2$: thickness of second electrode layer, width of laminated substrate, and $W_2$ and $W_3$: width of piezoelectric/electrostrictive element.

DETAILED DESCRIPTION OF THE INVENTION

Hereinafter, the embodiment of the present invention will be described, but it should be understood that the present invention is not limited to the following embodiment and that appropriate alteration, modification or the like added to the following embodiment based on the ordinary knowledge of a person with ordinary skill without departing from the scope of the present invention falls in the scope of the present invention.

1. Piezoelectric/Electrostrictive Element:

(Constitution of Piezoelectric/Electrostrictive Element)

FIG. 1 is a partially sectional view schematically showing one embodiment of a piezoelectric/electrostrictive element of the present invention. As shown in FIG. 1, in a piezoelectric/electrostrictive element 10 of the present embodiment, a film external terminal electrode 3 is disposed on the surface of a piezoelectric/electrostrictive body 2 constituting a piezoelectric/electrostrictive drive unit 1 (an uppermost layer piezoelectric/electrostrictive body 2a disposed in the uppermost layer of the piezoelectric/electrostrictive drive unit 1). The external terminal electrode 3 has a so-called laminated structure comprising a first electrode layer 3a disposed to contact the piezoelectric/electrostrictive body 2 (the uppermost layer piezoelectric/electrostrictive body 2a) closely and a second electrode layer 3b disposed on the first electrode layer 3a.

The first electrode layer 3a is an electrode layer made of a first electrode material (so-called 'cermet paste') containing (1) a first metal component for an electrode and (2) a piezoelectric/electrostrictive material of the same composition or substantially the same composition as that of the piezoelectric/electrostrictive material constituting the piezoelectric/electrostrictive body 2. That is, the first electrode layer 3a disposed to directly come in contact with the piezoelectric/electrostrictive body 2 (the uppermost layer piezoelectric/electrostrictive body 2a) contains the piezoelectric/electrostrictive material, and hence the uppermost layer piezoelectric/electrostrictive body 2a is adhered tightly to the first electrode layer 3a with a sufficiently high strength.

On the other hand, the second electrode layer 3b is an electrode layer which contains a second metal component for an electrode and which substantially does not contain the above piezoelectric/electrostrictive material. That is, the second electrode layer 3b disposed on the first electrode layer 3a is an electrode layer formed by using the material which substantially does not contain the piezoelectric/electrostrictive material. Therefore, the piezoelectric/electrostrictive material which is an insulator is not deposited (is scarcely deposited) on the outer surface of the layer, thereby acquiring a satisfactory conducting performance. It is to be noted that 'substantially does not contain the piezoelectric/electrostrictive material' mentioned in the present description means that a very small amount of the material might be contained to such an extent that the conducting performance of the external terminal electrode is not influenced. However, it is preferable that a second electrode material does not contain any piezoelectric/electrostrictive material (i.e., a content ratio=0%).

The external terminal electrode 3 of the piezoelectric/electrostrictive element 10 of the present embodiment has the above laminated structure. In the external terminal electrode 3, the first electrode layer 3a acquires adhesion with respect to the piezoelectric/electrostrictive body 2, and the second electrode layer 3b acquires the conducting performance of the electrode. Therefore, the piezoelectric/electrostrictive element 10 of the present embodiment possesses the external terminal electrode 3 excellent in the conducting performance, which is satisfactorily adhered tightly to the piezoelectric/electrostrictive body and does not easily peel therefrom.

Moreover, even when the piezoelectric/electrostrictive body 2 and the external terminal electrode 3 are simultaneously fired in a lump, the piezoelectric/electrostrictive material is not deposited on the surface of the external terminal electrode 3 (on the surface of the second electrode layer 3b). Therefore, the piezoelectric/electrostrictive element 10 of the present embodiment can be manufactured by firing the piezoelectric/electrostrictive body 2 and the external terminal electrode 3 simultaneously in a lump, whereby the number of firing times can be decreased to simplify manufacturing steps. The piezoelectric/electrostrictive element can simply and inexpensively be manufactured.

The external terminal electrode 3 of the piezoelectric/electrostrictive element 10 of the present embodiment is an electrode which substantially does not contain a so-called 'glass component'. When the external terminal electrode substantially does not contain the glass component, in the case of forming the piezoelectric/electrostrittive body and the external terminal electrode by simultaneous firing, the piezoelectric/electrostrictive porcelain composition does not react with the glass component. Therefore, it is preferable that the composition of the formed piezoelectric/electrostrictive body is not fluctuated easily, and the piezoelectric characteristics of the obtained piezoelectric/electrostrictive body are not deteriorated. Furthermore, the external terminal electrode substantially does not contain the glass component, thereby producing an effect that the conductor resistance of the external terminal electrode does not easily increase.

Specific examples of 'the glass component' mentioned in the present description include lead glass containing $SiO_2$, PbO, $B_2O_3$, ZnO, $Bi_2O_3$ and the like, borosilicate glass, and lead-borosilicate glass.

Moreover, the expression 'the glass component is not substantially contained' referred to in the present description means that the component might be contained in the conception of external terminal electrode in such a very small amount (specifically less than 1 mass %) that it does not influence on the composition of the piezoelectric/electrostrictive body formed when simultaneously fired. However, it is preferable that the external terminal electrode does not contain any glass component (i.e., a content ratio=0%).

A thickness $T_1$ of the first electrode layer is preferably from 2.0 to 8.0 µm, further preferably from 3.0 to 7.0 µm. When the thickness $T_1$ of the first electrode layer is less than 2.0 µm, it would be created such a state that second electrode layer come into contact with a piezoelectric/electrostrictive body as the outermost layer because of the narrowed effective electrode area of the first electrode layer caused by its shrinkage during firing. In consequence, the electrode easily peels off sometimes. On the other hand, when the thickness exceeds 8.0 µm, the piezoelectric/electrostrictive material is easily deposited on the surface of the second electrode layer $3b$ sometimes.

A thickness $T_2$ of the second electrode layer is preferably from 2.0 to 8.0 µm, further preferably from 3.0 to 7.0 µm. When the thickness $T_2$ of the second electrode layer is less than 2.0 µm, owing to the excessively small thickness, the piezoelectric/electrostrictive material is deposited on the surface of the second electrode layer $3b$ sometimes. On the other hand, when the thickness exceeds 8.0 µm, the sintering stress of the electrode strengthens, with the result that the piezoelectric/electrostrictive body is cracked along the contour of the external terminal electrode sometimes.

Moreover, the thickness ($=T_1+T_2$) of the whole external terminal electrode 3 is preferably from 5.0 to 16.0 µm, further preferably from 7.0 to 13.0 µm. When the thickness of the whole external terminal electrode 3 is less than 5.0 µm, the insulator (e.g., copper oxide (CuO) or the like) in the piezoelectric/electrostrictive body is deposited on the surface of the second electrode layer $3b$ sometimes. On the other hand, when the thickness exceeds 16.0 µm, the sintering stress of the electrode strengthens, with the result that the piezoelectric/electrostrictive body is cracked along the contour of the external terminal electrode sometimes.

Figure 2:
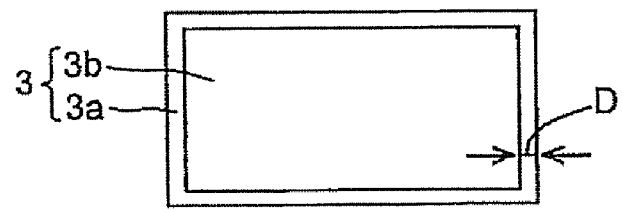
FIG. 2 is a top view schematically showing one example of an external terminal electrode used in the piezoelectric/electrostrictive element of the present invention.

FIG. 2 is a top view schematically showing one example of the external terminal electrode used in the piezoelectric/electrostrictive element of the present invention. As shown in FIG. 2, the arrangement region of the second electrode layer $3b$ constituting the external terminal electrode 3 is preferably smaller than that of the first electrode layer $3a$. A relation between the arrangement region of the first electrode layer $3a$ and the arrangement region of the second electrode layer $3b$ is set in this manner, whereby the second electrode layer $3b$ does not directly come in contact with the piezoelectric/electrostrictive body. Therefore, the external terminal electrode 3 does not peel from the piezoelectric/electrostrictive body. It is to be noted that a dimensional difference D between the arrangement region of the first electrode layer and the arrangement region of the second electrode layer may be set within the range of the accuracy of a technique for forming the external terminal electrode 3 so that the area of the second electrode layer $3b$ is maximized.

Figure 10A:
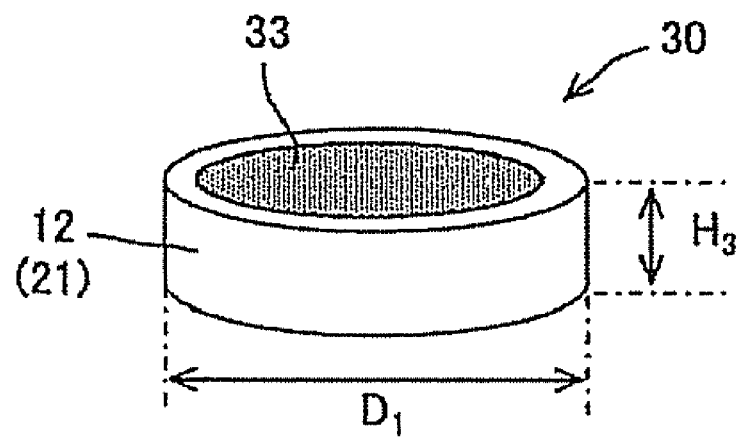
FIG. 10A is a perspective view schematically showing another embodiment of the piezoelectric/electrostrictive element of the present invention.
Figure 10B:
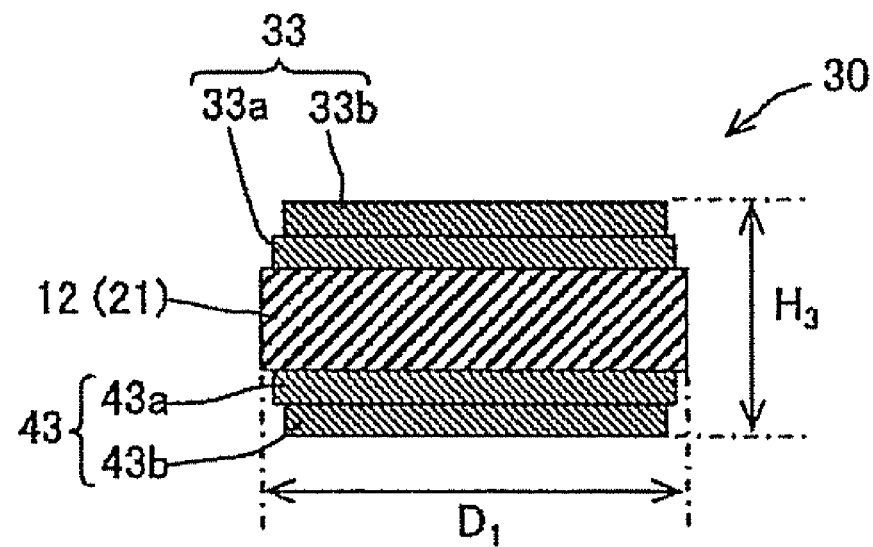
FIG. 10B is a sectional view schematically showing another embodiment of the piezoelectric/electrostrictive element of the present invention.

FIG. 10A is a perspective view schematically showing another embodiment of the piezoelectric/electrostrictive element of the present invention. Moreover, FIG. 10B is a sectional view schematically showing another embodiment of the piezoelectric/electrostrictive element of the present invention. As shown in FIGS. 10A and 10B, a piezoelectric/electrostrictive element 30 of the present embodiment possesses a disc-like (columnar) piezoelectric/electrostrictive body 12 (a piezoelectric/electrostrictive drive unit 21), and film external terminal electrodes 33 and 43 disposed on a pair of opposite surfaces of the piezoelectric/electrostrictive body 12. The external terminal electrodes 33 and 43 comprise the first electrode layers $33a$ and $43a$ made of a first electrode material and the second electrode layers $33b$ and $43b$ disposed on the first electrode layers $33a$ and $43a$ and made of a second electrode material, respectively. The piezoelectric/electrostrictive element 30 having a constitution shown in FIGS. 10A and 10B is suitable as, for example, an ultrasonic transducer, a buzzer or the like.

When it is supposed that the piezoelectric/electrostrictive element 30 shown in FIGS. 10A and 10B is used as, for example, the ultrasonic transducer, the buzzer or the like, a diameter $D_1$ of the piezoelectric/electrostrictive element is from about 15 to 25 mm, and a height $H_3$ of the piezoelectric/electrostrictive element is from about 1.5 to 2.5 mm.

Figure 11A:
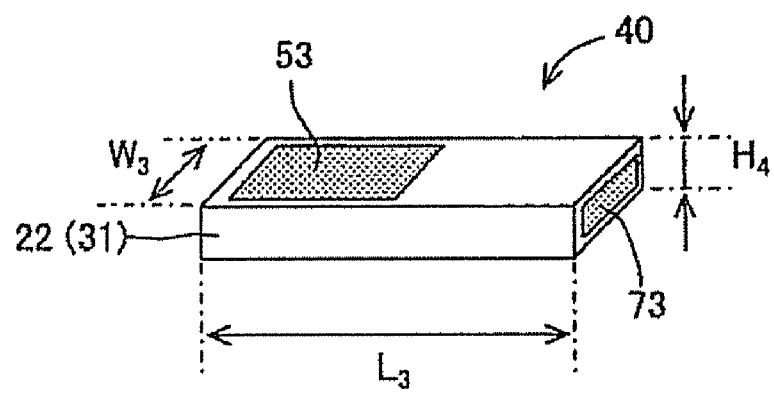
FIG. 11A is a perspective view schematically showing still another embodiment of the piezoelectric/electrostrictive element of the present invention.
Figure 11B:
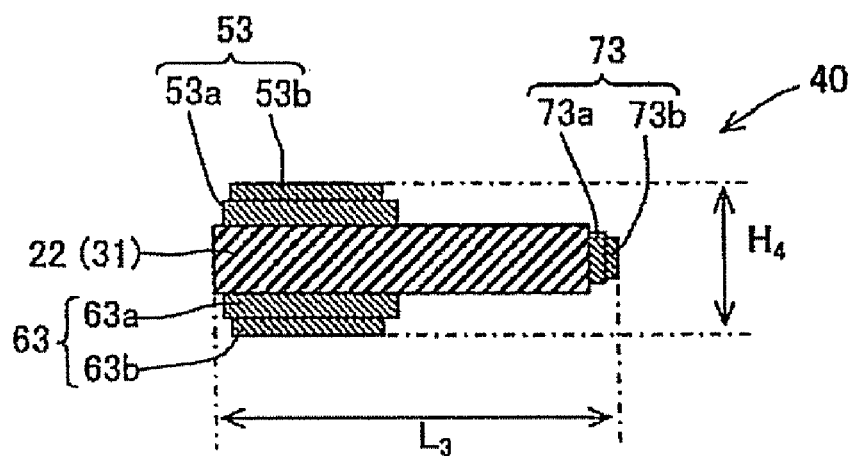
FIG. 11B is a sectional view schematically showing still another embodiment of the piezoelectric/electrostrictive element of the present invention.

FIG. 11A is a perspective view schematically showing still another embodiment of the piezoelectric/electrostrictive element of the present invention. Moreover, FIG. 11B is a sectional view schematically showing still another embodiment of the piezoelectric/electrostrictive element of the present invention. As shown in FIGS. 11A and 11B, a piezoelectric/electrostrictive element 40 of the present embodiment comprises a plate-like (rectangular) piezoelectric/electrostrictive body 22 (a piezoelectric/electrostrictive drive unit 31) and film external terminal electrodes 53, 63 and 73 disposed on a pair of opposite surfaces and one side surface of the piezoelectric/electrostrictive body 22. The external terminal electrodes 53, 63 and 73 comprise the first electrode layers $53a$, $63a$ and $73a$ made of a first electrode material and the second electrode layers $53b$, $63b$ and $73b$ disposed on the first electrode layers $53a$, $63a$ and $73a$ and made of a second electrode material, respectively. The piezoelectric/electrostrictive element 40 having a constitution shown in FIGS. 11A and 11B is suitable as, for example, a piezoelectric transformer or the like.

When it is supposed that the piezoelectric/electrostrictive element 40 shown in FIGS. 11A and 11B is used as, for example, the piezoelectric transformer, a length $L_3$ of the piezoelectric/electrostrictive element is from about 25 to 35 mm, a height $H_4$ of the piezoelectric/electrostrictive element is from about 4 to 6 mm, and a width $W_3$ of the piezoelectric/electrostrictive element is from about 8 to 12 mm.

Figure 13A:
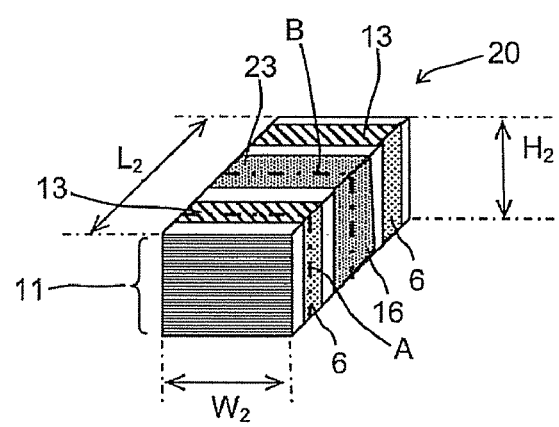
FIG. 13A is a perspective view schematically showing still another embodiment of the piezoelectric/electrostrictive element of the present invention.

FIG. 13A is a perspective view schematically showing still another embodiment of the piezoelectric/electrostrictive element of the present invention. As shown in FIG. 13A, a piezoelectric/electrostrictive element 20 of the present embodiment comprises a piezoelectric/electrostrictive drive unit 11. The piezoelectric/electrostrictive drive unit 11 is a columnar laminated body having a constitution obtained by alternately laminating a plurality of film piezoelectric/electrostrictive bodies and a plurality of film internal electrodes. Moreover, side electrodes 6 and 16 are disposed on the side surfaces of the piezoelectric/electrostrictive element 20. The side electrodes 6 and 16 electrically connect external terminal electrodes 13 and 23 to internal electrodes.

Figure 13B:
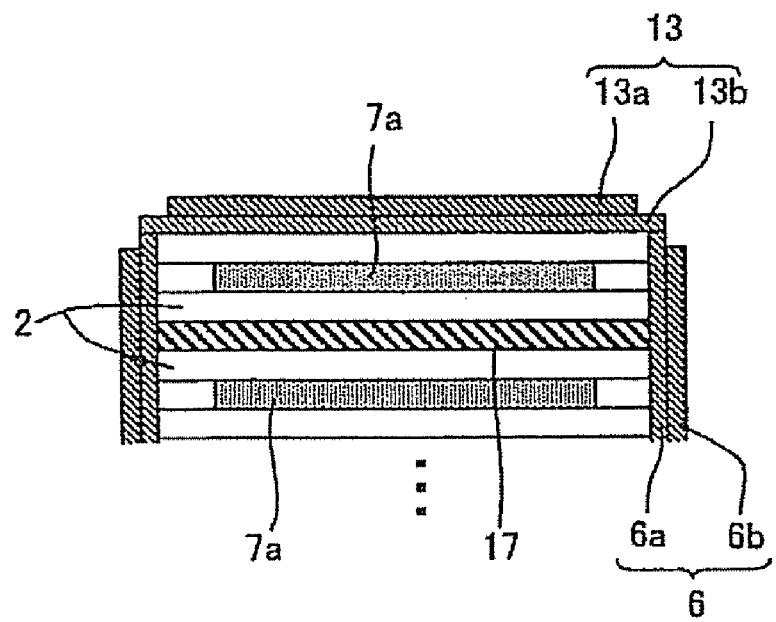
FIG. 13B is a partially sectional view showing the piezoelectric/electrostrictive element cut along the A line of FIG. 13A.
Figure 13C:
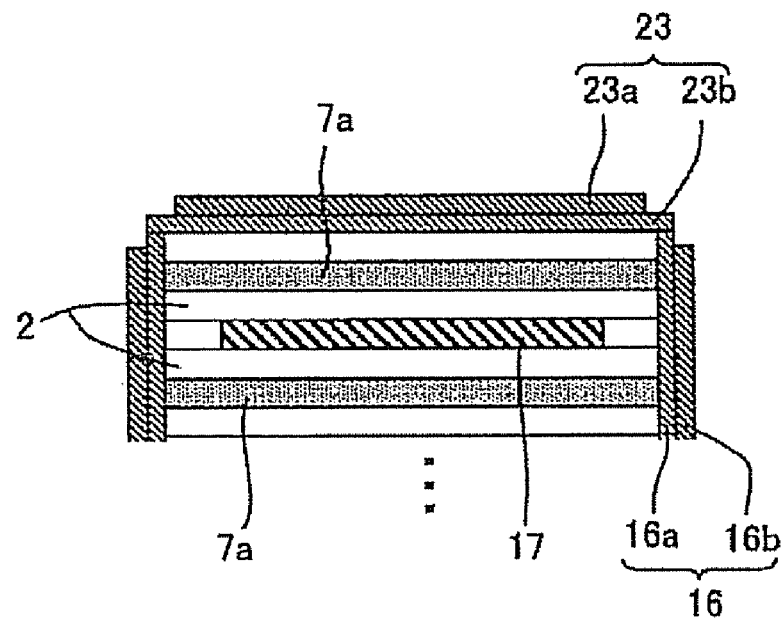
FIG. 13C is a partially sectional view showing the piezoelectric/electrostrictive element cut along the B line of FIG. 13A.

FIG. 13B is a partially sectional view showing the piezoelectric/electrostrictive element 20 cut along the A line of FIG. 13A. Moreover, FIG. 13C is a partially sectional view showing the piezoelectric/electrostrictive element 20 cut along the B line of FIG. 13A. As shown in FIGS. 13B and 13C, the side electrodes 6 and 16 disposed on the side surfaces of the piezoelectric/electrostrictive element 20 are preferably electrodes having so-called laminated structures including the first electrode layers 6a and 16a disposed to contact the piezoelectric/electrostrictive body 2 closely and the second electrode layers 6b, 16b disposed on the first electrode layers 6a and 16a, respectively, in the same manner as in the external terminal electrodes 13 and 23. It is to be noted that the side electrodes 6 are electrically connected to a common internal electrode 17 in the cross section of the piezoelectric/electrostrictive element 20 cut along the A line (see FIG. 13B). Moreover, the side electrodes 16 are electrically connected to internal electrodes 7a in the cross section of the piezoelectric/electrostrictive element 20 cut along the B line (see FIG. 13C).

There is not any special restriction on the external dimension of the piezoelectric/electrostrictive element 20 comprising the piezoelectric/electrostrictive drive unit 11 which is a columnar laminated body as shown in FIG. 13A, and the dimension can appropriately be set in accordance with a used configuration. When it is supposed that the piezoelectric/electrostrictive element 20 is used as, for example, an ultrasonic motor, a height $H_2$ of the piezoelectric/electrostrictive element is from about 0.4 to 3 mm, a length $L_2$ of the piezoelectric/electrostrictive element is from about 2 to 10 mm, and a width $W_2$ of the piezoelectric/electrostrictive element is from about 0.5 to 3 mm.

(Piezoelectric/Electrostrictive Material)

The piezoelectric/electrostrictive body constituting the piezoelectric/electrostrictive drive unit 11 is made of a piezoelectric/electrostrictive material. There is not any special restriction on the kind of the piezoelectric/electrostrictive material, but from the viewpoint of piezoelectric/electrostrictive characteristics, the material is preferably a lead-zirconate-titanate(PZT)-based piezoelectric/electrostrictive porcelain composition. Moreover, preferable examples of the PZT-based piezoelectric/electrostrictive porcelain composition include a composition containing 65 to 70 mass % of Pb in terms of PbO, 7.0 to 16.0 mass % of Ti in terms of $TiO_2$. 10.5 to 24.5 mass % of Zr in terms of $ZrO_2$, 0.65 to 1.05 mass % of Sb in terms of $Sb_2O_3$, 0.5 to 0.8 mass % of Nb in terms of $Nb_2O_5$, 0.3 to 0.7 mass % of Cu in terms of CuO, 0.6 to 1.5 mass % of W in terms of $WO_3$ and 0.3 to 0.7 mass % of Mn in terms of $MnO_2$, in which a molar content ratio between Cu and W is in a range of 1.5:1 to 2.5:1. The above piezoelectric/electrostrictive porcelain composition is sufficiently densified even at a firing temperature of 1050° C. or less, and exerts excellent piezoelectric/electrostrictive characteristics. Furthermore, the piezoelectric/electrostrictive element manufactured by using the above piezoelectric/electrostrictive porcelain composition has such characteristics that the temperature variance ratio of a resonance frequency is small.

(First Electrode Material)

In addition to the piezoelectric/electrostrictive material, the first electrode material contains a first metal component which is a metal component for the electrode used to constitute a usual piezoelectric/electrostrictive element electrode. Specific examples of this first metal component include a component containing Ag, Pd, Pt, Au or an alloy of them as a main component. Above all, a metal component containing Ag and Pd and obtained by a coprecipitation method, a metal component of an alloy containing Ag and Pd or the like is preferable. It is to be noted that this first metal component is preferably an alloy of Ag and Pd from the viewpoint of effectively suppressing the peeling from the piezoelectric/electrostrictive body.

The first metal component preferably contains 60 to 90 mass % of Ag and 10 to 40 mass % of Pd (with the proviso that Ag+Pd=100 mass %). When the metal component containing Ag and Pd at a content ratio in the above numeric range is used, it is possible to suppress the amount of Ag to be dispersed in the piezoelectric/electrostrictive body during firing. Moreover, when the total of the first metal component and the piezoelectric/electrostrictive material is 100 vol %, the ratio of the piezoelectric/electrostrictive material contained in the first electrode material is preferably from 10 to 50 vol %, further preferably from 15 to 30 vol %, especially preferably from 18 to 22 vol %. The ratio of the piezoelectric/electrostrictive material contained in the first electrode material is set to the above numeric range, whereby the peeling of the formed external terminal electrode from the piezoelectric/electrostrictive body can effectively be inhibited.

(Second Electrode Material)

The second electrode material also contains a second metal component which is the metal component for the electrode used to constitute the usual piezoelectric/electrostrictive element electrode in the same manner as in the first electrode material. This second metal component is in the same element system as that of the first metal component contained in the first electrode material. When the first and second metal components are in the same element system, it is preferable that the adhesion between the formed first electrode layer and second electrode layer improves. It is to be noted that the expression 'the same element system' referred to in the present description means that the same kind of metal component(s) are contained without fail. However, when a plurality of kinds of metal elements are contained, a ratio (a content ratio) of these metal elements may be the same or different.

Specific examples of the second metal component include a component containing Ag, Pd, Pt, Au or an alloy of them as a main component. Above all, a metal component containing Ag and Pd and obtained by a coprecipitation method, a metal component of an alloy containing Ag and Pd or the like is preferable. It is to be noted that this second metal component is preferably an alloy of Ag and Pd. Moreover, the second metal component contains 60 to 90 mass % of Ag and 10 to 40 mass % of Pd (with the proviso that Ag+Pd=100 mass %), and is further preferably the same as the first metal component.

(Electrode Material for Internal Electrode)

When the piezoelectric/electrostrictive element of the present invention comprises the piezoelectric/electrostrictive drive unit 11 having the laminated structure shown in, for example, FIG. 13A, the internal electrode constituting this piezoelectric/electrostrictive drive unit is made of, for example, an electrode material for the internal electrode. Moreover, this electrode material for the internal electrode usually contains a third metal component which is the metal component for the electrode. This third metal component is preferably in the same element system as that of the above first and second metal components. When the third metal component is in the same element system as that of the first and second metal components, the adhesion of a connecting portion between the internal electrode and the external terminal electrode improves. Moreover, from the viewpoint of migration characteristics, the third metal component is preferably in the same element system. Specific examples of the third metal component are similar to those of the first metal component.

2. Method for Manufacturing a Piezoelectric/Electrostrictive Element:

Next, a method for manufacturing a piezoelectric/electrostrictive element of the present invention will be described. The method for manufacturing the piezoelectric/electrostrictive element of the present invention comprises a step of disposing, on the surface of a piezoelectric/electrostrictive precursor, a first electrode material containing a first metal component and a piezoelectric/electrostrictive material in the form of a film to form a first electrode layer precursor (hereinafter referred to also as 'the step (1)'); a step of disposing, on the first electrode layer precursor, a second electrode material which contains a second metal component in the same element system as that of the first metal component and which substantially does not contain the piezoelectric/electrostrictive material in the form of a film to form a second electrode layer precursor (hereinafter referred to also as 'the step (2)'); and a step of integrally firing the piezoelectric/electrostrictive precursor, the first electrode layer precursor and the second electrode layer precursor to dispose, on the surface of a piezoelectric/electrostrictive body, a film external terminal electrode which has a laminated structure comprising a first electrode layer disposed to contact the piezoelectric/electrostrictive body closely and a second electrode layer disposed on the first electrode layer and which substantially does not contain a glass component (hereinafter referred to also as 'the step (3)').

(Step (1))

In the step (1), the first electrode material is disposed in the form of a film on the surface of the piezoelectric/electrostrictive precursor to form the first electrode layer precursor. The piezoelectric/electrostrictive precursor is an unfired formed body obtained by using the piezoelectric/electrostrictive material, and the precursor is fired to form the piezoelectric/electrostrictive body. This piezoelectric/electrostrictive precursor can be manufactured by, for example, forming with the piezoelectric/electrostrictive material. It is to be noted that after the forming with the piezoelectric/electrostrictive material, the electrode material for the internal electrode, which is fired to form the internal electrode, may be disposed in the form of the film by a screen printing method or the like. If necessary, the forming of an adhesive layer or the like may further be performed to form a laminated structure.

To prepare the piezoelectric/electrostrictive material (the piezoelectric/electrostrictive porcelain composition), first, single-element units such as Pb, Sb, Nb, Zr, Ti, Mn, Cu and W, oxides of these elements (PbO, $Pb_3O_4$, $Sb_2O_3$, $Nb_2O_5$, $TiO_2$, $ZrO_2$, MnO, $MnO_2$, CuO, $Cu_2O$, $WO_3$, etc.), carbonates ($MnCO_3$, etc.), compounds ($SbNbO_2$, etc.) containing a plural kinds of above elements and the like are mixed so that the elements are contained at a desirable composition ratio. As a mixing method, a usual method may be used, and examples of the method include ball milling. More specifically, the predetermined amounts of the materials, cobble stones and water are placed in a ball mill device, and the device is rotated for a predetermined time to prepare a mixed slurry. The water contained in the mixed slurry prepared is evaporated to dry, or removed by filtering or the like, whereby a mixed material can be obtained. The resultant mixed material is calcinated at 500 to 1000° C., and then ground by a usual grinding device such as a ball mill, an attritor or a bead mill, whereby a particulate piezoelectric/electrostrictive porcelain composition can be prepared. It is to be noted that the piezoelectric/electrostrictive porcelain composition may be prepared by calcinating and grinding a mixed material obtained by mixing a plural kinds of prepared secondary materials which has been prepared by mixing a part of a raw material to obtain mixed raw material, and then calcinating and grinding the resultant mixed raw material.

The average particle diameter of the prepared particulate piezoelectric/electrostrictive porcelain composition is preferably from 0.03 to 1.0 μm, further preferably from 0.05 to 0.5 μm. The particle diameters may be regulated by the heat treatment of the resultant ground particulate piezoelectric/electrostrictive porcelain composition at 400 to 750° C. Finer particles can preferably be integrated with other particles to decrease the unevenness of the particle diameters, thereby forming the piezoelectric/electrostrictive body having uniform particle diameters. It is to be noted that the piezoelectric/electrostrictive porcelain composition may be prepared by, for example, an alkoxide method, a coprecipitation method or the like.

After adding a plasticizer, a dispersant, a solvent and the like to the prepared piezoelectric/electrostrictive porcelain composition (the piezoelectric/electrostrictive material), the resultant composition is slurried by using a usual mixing device such as the ball mill. Afterward, tape-forming is performed by using a usual sheet forming machine such as a doctor blade, whereby it is possible to obtain a formed green body which is a film piezoelectric/electrostrictive precursor.

Subsequently, the first electrode material is disposed on one surface of the resultant formed green body (the piezoelectric/electrostrictive precursor) to form the film first electrode layer precursor having desirable dimension and pattern. This first electrode layer precursor is a portion which is fired to constitute the first electrode layer as a part of the external terminal electrode. There is not any special restriction on a method for forming the first electrode layer precursor, but a screen printing method using a usual film forming device is preferable because the precursor can be formed accurately at a high speed.

(Step (2))

In the step (2), the second electrode material is disposed in the form of the film on the first electrode layer precursor formed in the step (1) to form the second electrode layer precursor. This second electrode layer precursor is fired to constitute the second electrode layer as a part of the external terminal electrode. There is not any special restriction on a method for forming the second electrode layer precursor, but a screen printing method using a usual film forming device is preferable because the precursor can be formed accurately at a high speed.

(Step (3))

In the step (3), the piezoelectric/electrostrictive precursor, the first electrode layer precursor and the second electrode layer precursor are integrally fired. The piezoelectric/electrostrictive precursor is fired to form the piezoelectric/electrostrictive body, and the first and second electrode layer precursors are fired to form the first electrode layer and the second electrode layer, respectively, thereby integrally constituting the external terminal electrode.

The firing may be performed by a conventional method using a heating device such as an electric furnace. A firing temperature depends on the composition of the piezoelectric/electrostrictive material or the electrode material or the like. However, when the first and second metal components are, for example, Ag, Pd or coprecipitation or alloy powder of them, the firing temperature is usually from 860 to 960° C., preferably from 880 to 940° C. Moreover, a time to hold the highest temperature is usually from 1.0 to 5.0 hours, preferably from 1.5 to 3.5 hours.

As already described, the second electrode material used to form the second electrode layer precursor is an electrode material which substantially does not contain the piezoelectric/electrostrictive material. Therefore, even when the piezoelectric/electrostrictive precursor, the first electrode layer precursor and the second electrode layer precursor are integrally fired, the piezoelectric/electrostrictive material is not deposited on the surface of the formed external terminal electrode (on the surface of the second electrode layer). Therefore, the firing of the piezoelectric/electrostrictive body and the firing of the external terminal electrode, which have heretofore been performed in separate steps, can be performed together, which can shorten the manufacturing steps.

(Manufacturing of Piezoelectric/Electrostrictive Element)

Figure 3:
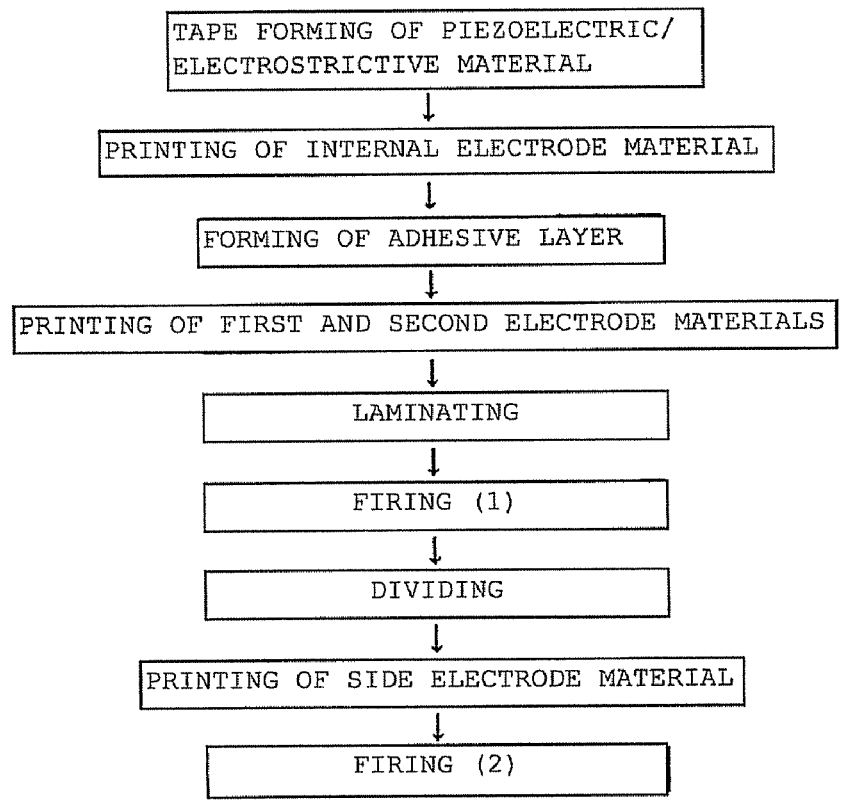
FIG. 3 is a flow chart for explaining one embodiment of the method for manufacturing a piezoelectric/electrostrictive element of the present invention.

FIG. 3 is a flow chart for explaining one embodiment of the method for manufacturing of the piezoelectric/electrostrictive element of the present invention. As shown in FIG. 3, in the method for manufacturing of the piezoelectric/electrostrictive element of the present embodiment, on each of a plurality of formed green bodies obtained by the tape forming of a piezoelectric/electrostrictive material, an internal electrode material is printed by a screen printing method or the like. After forming an adhesive layer if necessary, the first and second electrode materials are printed on one formed green body disposed in the uppermost layer in series. The plurality of formed green bodies are laminated so that the formed green body on which the first and second electrode materials are printed is the uppermost layer. After pressurizing and integrating the bodies if necessary, first firing (the firing (1)) is performed, whereby a laminated substrate 4 can be obtained as shown in FIG. 12.

Figure 12:
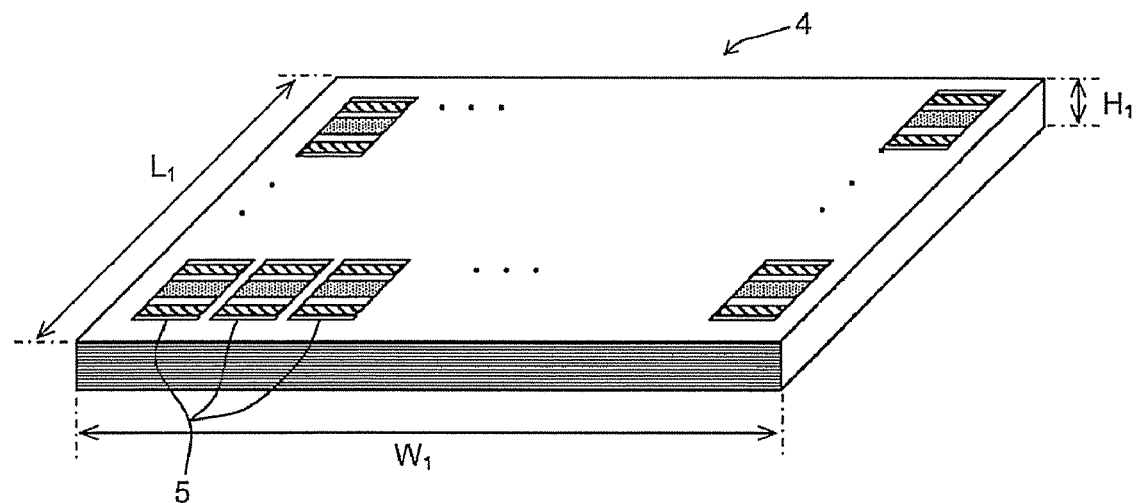
FIG. 12 is a perspective view schematically showing one example of a laminated substrate.

The laminated substrate 4 shown in FIG. 12 has a plurality of product portions 5. The laminated substrate 4 is divided along the outer shapes of the product portions 5 to obtain a plurality of divided bodies. After printing a side electrode material on the side surfaces of the resultant divided bodies or the like, second firing (firing (2)) is performed, so that the piezoelectric/electrostrictive element 20 shown in FIG. 13A can be obtained.

Figure 7:
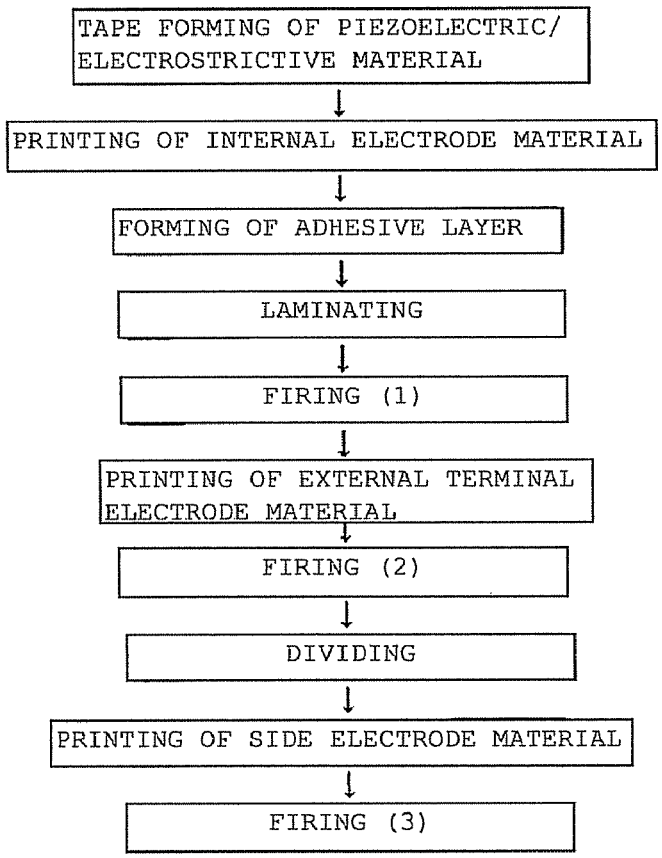
FIG. 7 is a flow chart for explaining one example of a conventional method for manufacturing the piezoelectric/electrostrictive element.

FIG. 7 is a flow chart showing one embodiment of a conventional method for manufacturing the piezoelectric/electrostrictive element. As shown in FIG. 7, it has heretofore been necessary to separately perform the firing of a piezoelectric/electrostrictive material and the firing of electrodes, and hence it has been necessary to perform the firing at least twice, i.e., the firing (1) and the firing (2) (at least three times, when the firing of the side electrodes (the firing (3)) is included). On the other hand, in the method of manufacturing the piezoelectric/electrostrictive element of the present embodiment, the firing of the piezoelectric/electrostrictive material can be performed simultaneously with the firing of the electrodes. In consequence, the manufacturing steps can be simplified also preferably from the aspect of energy cost.

Figure 4A:
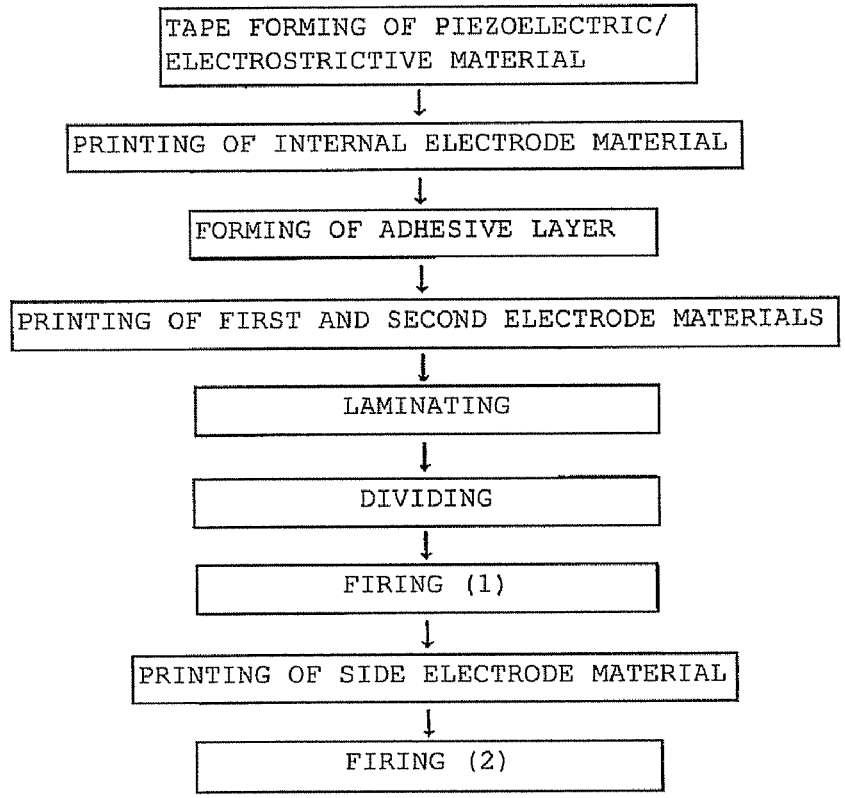
FIG. 4A is a flow chart for explaining another embodiment of the method for manufacturing the piezoelectric/electrostrictive element of the present invention.
Figure 4B:
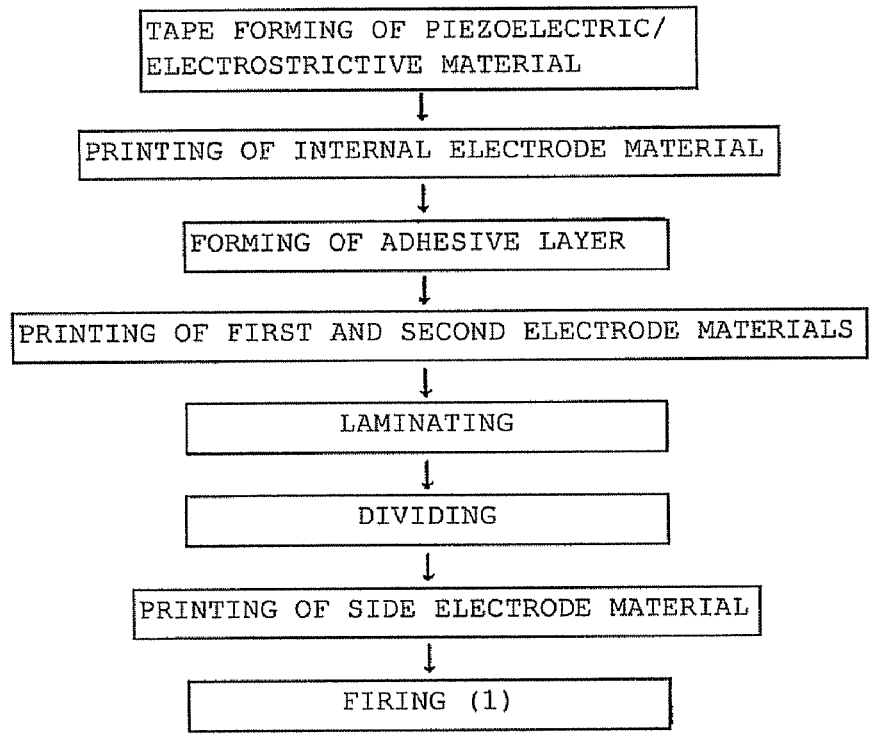
FIG. 4B is a flow chart for explaining still another embodiment of the method for manufacturing the piezoelectric/electrostrictive element of the present invention.
Figure 5:
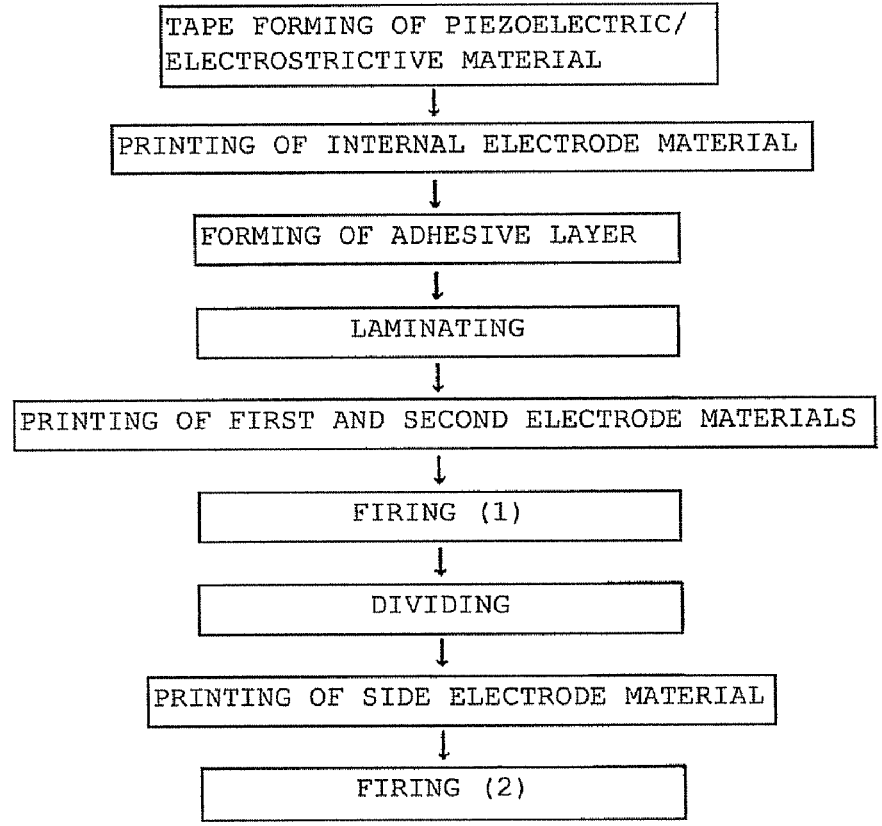
FIG. 5 is a flow chart for explaining a further embodiment of the method for manufacturing the piezoelectric/electrostrictive element of the present invention.
Figure 6:
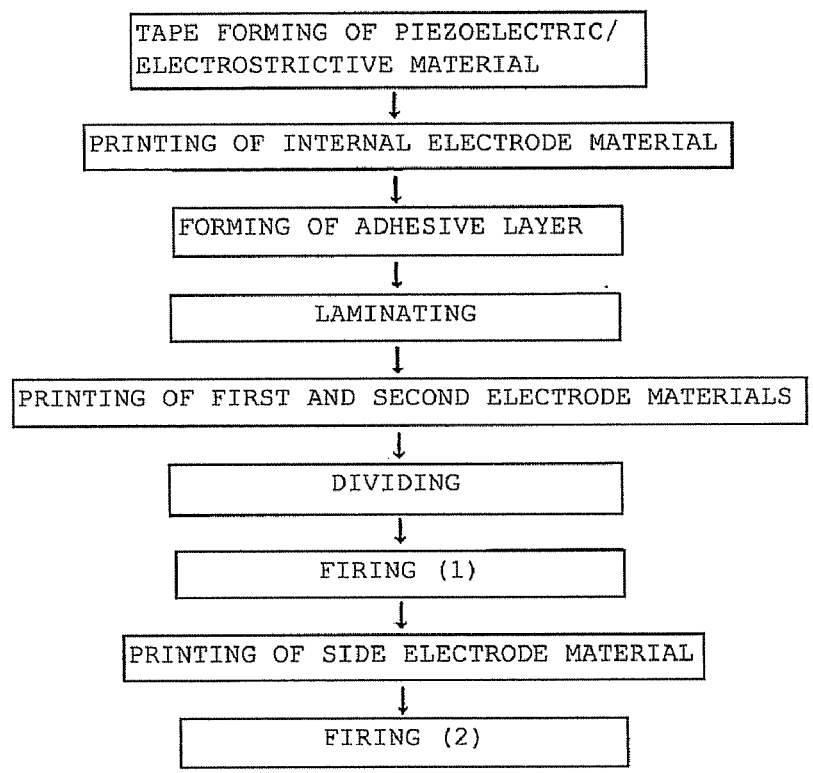
FIG. 6 is a flow chart for explaining a still further embodiment of the method for manufacturing the piezoelectric/electrostrictive element of the present invention.

It is to be noted that in the embodiment shown in FIG. 3, subsequently to the firing (1), the dividing of the laminated substrate is performed, but the firing (1) may be performed after the dividing as in an embodiment shown in FIG. 4A. Furthermore, as in an embodiment shown in FIG. 4B, a side electrode material may be printed without performing the firing after the dividing, followed by performing the firing (1). In the embodiment shown in FIG. 4B, the number of firing times is only one, and hence the manufacturing steps are further simplified further preferably from the aspect of the energy cost. Moreover, as in embodiments shown in FIGS. 5 and 6, the first and second electrode materials may be printed after laminating the formed green bodies.

In the piezoelectric/electrostrictive element 20 shown in FIG. 13A, the external terminal electrodes 13 and 23 are disposed in three portions on the surface of the piezoelectric/electrostrictive body disposed in the uppermost layer of the piezoelectric/electrostrictive drive unit 11. Moreover, on the side surfaces of the piezoelectric/electrostrictive drive unit 11, there are disposed three side electrodes 6 and 16 which electrically connect the external terminal electrodes 13 and 23 to the internal electrodes, respectively. It is to be noted that on another side surface (not shown) of the piezoelectric/electrostrictive drive unit 11, a side electrode is disposed to electrically connect the external terminal electrode 23 to the internal electrode.

Figure 14:
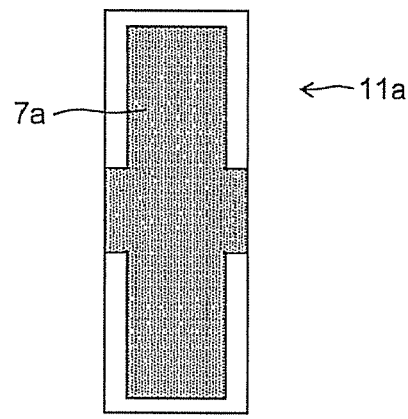
FIG. 14 is a schematic view showing one example of the arrangement configuration of an internal electrode.
Figure 15:
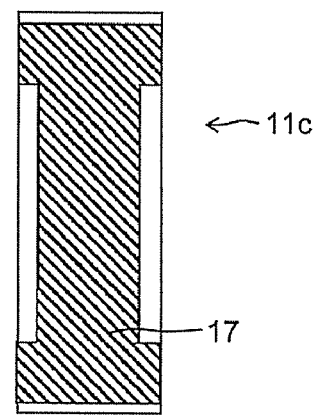
FIG. 15 is a schematic view showing one example of the arrangement configuration of a common internal electrode.
Figure 16:
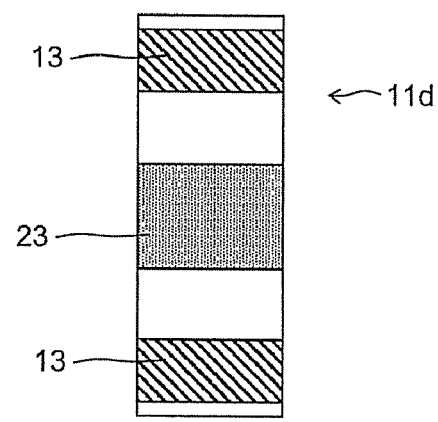
FIG. 16 is a schematic view showing one example of the arrangement configuration of the external terminal electrode.
Figure 17:
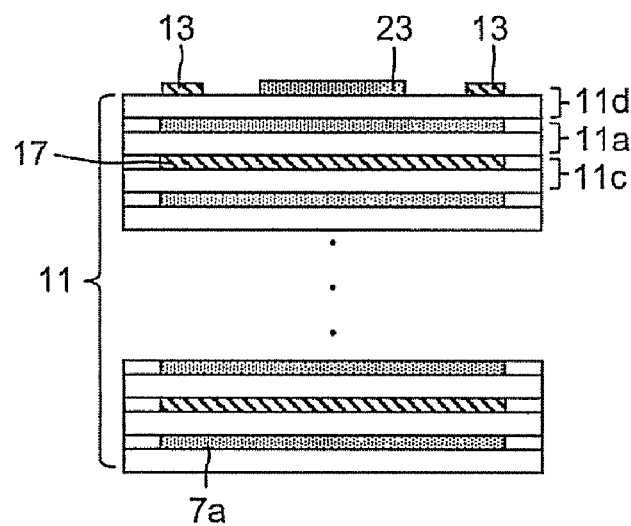
FIG. 17 is an exploded front view schematically showing another embodiment of the piezoelectric/electrostrictive element of the present invention.
Figure 18:
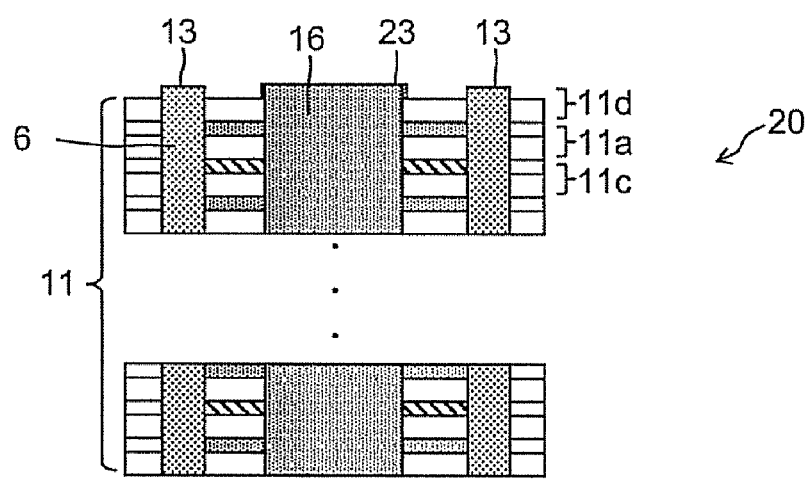
FIG. 18 is a front view schematically showing one example of the arrangement configuration of the side electrodes.

The piezoelectric/electrostrictive drive unit 11 shown in FIG. 13A has a constitution obtained by laminating a plural kinds of board elements 11a, 11c and 11d possessing electrodes (the internal electrode 7a, the common electrode 17 and the external terminal electrodes 13 and 23) having arrangement configurations as shown in FIGS. 14 to 16. It is to be noted that FIG. 17 is an exploded front view schematically showing another embodiment of the piezoelectric/electrostrictive element of the present invention. The number of the plural kinds of the board elements 11a, 11c and 11d, the laminating order of them and the like are appropriately designed in accordance with the use purpose of the piezoelectric/electrostrictive element or the like. When the side electrodes 6 and 16 are disposed on the side surfaces of the piezoelectric/electrostrictive drive unit 11, the piezoelectric/electrostrictive element 20 shown in FIG. 18 can be manufactured.

EXAMPLES

Hereinafter, the present invention will specifically be described with respect to examples, but the present invention is not limited to these examples.

(Manufacturing of Piezoelectric/Electrostrictive Porcelain Composition)

Materials, i.e., 68.5 mass % of PbO, 11.7 mass % of $TiO_2$, 17.5 mass % of $ZrO_2$, 0.90 mass % of $Sb_2O_3$, 0.82 mass % of $Nb_2O_5$ and 0.60 mass % of $MnCO_3$ in terms of $MnO_2$ were weighed, and mixed with the predetermined amount of water for 24 hours by a ball mill to obtain a prepared slurry. The resultant prepared slurry was placed in a hot-air drier to evaporate the water, followed by drying, to obtain the mixed material. The resultant mixed material was placed in a sheath made of magnesia, the sheath was closed with a cover made of magnesia, and the material was heated and calcinated at 1000° C. in an electric furnace to obtain a calcinated material. The resultant calcinated material was ground with the predetermined amount of the water by the ball mill for a predetermined time, placed in the hot-air drier to evaporate the water, and dried to obtain a first secondary material.

Materials, i.e., 53.3 mass % of PbO, 19.0 mass % of CuO and 27.7 mass % of $WO_3$ were weighed, and mixed with the predetermined amount of the water for 24 hours by the ball mill, to obtain a prepared slurry. The resultant prepared slurry was placed in the hot-air drier to evaporate the water, followed by drying, to obtain the mixed material. The resultant mixed material was placed in the sheath made of magnesia, the sheath was closed with the cover made of magnesia, and the material was heated and calcinated at 800° C. in the electric furnace to obtain the calcinated material. The resultant calcinated material was ground with the predetermined amount of the water by the ball mill for a predetermined time, and then placed in the hot-air drier to evaporate the water, followed by drying, to obtain a second secondary material.

97.4 parts by mass of the first secondary material, 2.6 parts by mass of the second secondary material and the predetermined amount of the water were placed in the ball mill, and mixed for 24 hours to obtain a prepared slurry. The resultant prepared slurry was placed in the hot-air drier to evaporate the water, followed by drying, to obtain a mixed material. The resultant mixed material was placed in the sheath made of magnesia, the sheath was closed with the cover made of magnesia, and the material was heated and calcinated at 800° C. in the electric furnace to obtain the calcinated material. The resultant calcinated material was ground with the predetermined amount of the water by the ball mill for a predetermined time, and then placed in the hot-air drier to evaporate the water, followed by drying, to obtain a piezoelectric/electrostrictive porcelain composition.

Reference Examples 1 to 18

A piezoelectric/electrostrictive porcelain composition, a dispersant, a plasticizer and a solvent were mixed to prepare a slurry, and tape forming was performed by a doctor blade method, to prepare a green sheet. It is to be noted that the thickness of the prepared green sheet was designed so that the thickness thereof became 36 μm after firing. On the green sheet, a pasted electrode material containing a metal component shown in Table 1 (Ag—Pd coprecipitation powder prepared by a coprecipitation method, Ag—Pd allow powder or Pt) was printed in a predetermined shape by a screen printing method. It is to be noted that the electrode material was printed so that the thickness thereof became 1.5 μm after the firing. Furthermore, on the electrode material, an adhesive layer was printed so that the thickness thereof became 2.0 μm after the firing.

The printed green sheets for 30 layers were laminated and thermo compression bonded to prepare a laminated substrate including 100 (=20×5) product portions. A height $H_1$ of the resultant laminated substrate was 1.6 mm, a length $L_1$ of the laminated substrate was 100 mm, and a width $W_1$ of the laminated substrate was 100 mm. After firing the resultant laminated substrate at 900° C. in an electric furnace (the highest temperature holding time: 3 hours), the substrate was divided to cut out 100 product portions. Side electrodes were disposed by using a pasted side electrode material containing Ag—Pd alloy powder (Ag:Pd=70:30 (mass ratio)) on side surface portions of the cutout product portions to manufacture 100 piezoelectric/electrostrictive elements. A height $H_2$ of the manufactured piezoelectric/electrostrictive element was 1.2 mm, a length $L_2$ of the piezoelectric/electrostrictive element was 5.0 mm, and a width $W_2$ of the piezoelectric/electrostrictive element was 2.0 mm.

The surface of each manufactured piezoelectric/electrostrictive element was observed with a stereomicroscope (15 times) to inspect the presence/absence of the peeling of an external terminal electrode from a piezoelectric/electrostrictive body, and an electrode peel occurrence ratio was calculated. The results are shown in Table 1.

TABLE 1

| | Metal component contained in electrode material*[1] | Ratio of piezoelectric/ electrostrictive porcelain composition contained in electrode material (mass %) | Electrode peel occurrence ratio (%) |
|---|---|---|---|
| Reference Example 1 | Ag—Pd coprecipitation powder (Ag:Pd = 7:3) | 0 | 100 |
| Reference Example 2 | Ag—Pd coprecipitation powder (Ag:Pd = 7:3) | 3 | 85 |
| Reference Example 3 | Ag—Pd coprecipitation powder (Ag:Pd = 7:3) | 10 | 50 |
| Reference Example 4 | Ag—Pd coprecipitation powder (Ag:Pd = 7:3) | 20 | 20 |
| Reference Example 5 | Ag—Pd coprecipitation powder (Ag:Pd = 7:3) | 50 | 0 |
| Reference Example 6 | Ag—Pd coprecipitation powder (Ag:Pd = 7:3) | 0 | 10 |
| Reference Example 7 | Ag—Pd coprecipitation powder (Ag:Pd = 7:3) | 3 | 5 |
| Reference Example 8 | Ag—Pd coprecipitation powder (Ag:Pd = 7:3) | 10 | 0 |
| Reference Example 9 | Ag—Pd coprecipitation powder (Ag:Pd = 7:3) | 20 | 0 |
| Reference Example 10 | Ag—Pd coprecipitation powder (Ag:Pd = 7:3) | 50 | 0 |
| Reference Example 11 | Ag—Pd alloy powder (Ag:Pd = 8:2) | 0 | 18 |
| Reference Example 12 | Ag—Pd alloy powder (Ag:Pd = 8:2) | 20 | 0 |
| Reference Example 13 | Ag—Pd alloy powder (Ag:Pd = 9:1) | 0 | 24 |
| Reference Example 14 | Ag—Pd alloy powder (Ag:Pd = 9:1) | 20 | 0 |
| Reference Example 15 | Ag—Pd alloy powder (Ag:Pt = 8:2) | 0 | 16 |
| Reference Example 16 | Ag—Pd alloy powder (Ag:Pt = 8:2) | 20 | 0 |
| Reference Example 17 | Pt | 0 | 30 |
| Reference Example 18 | Pt | 20 | 0 |

*[1]The ratio in parentheses indicates 'a mass ratio'.

Example 1

A piezoelectric/electrostrictive porcelain composition, a dispersant, a plasticizer and a solvent were mixed to prepare a slurry, and tape forming was performed by a doctor blade method, to prepare a green sheet. On the green sheet, a pasted first electrode material containing 97 mass % of Ag—Pd alloy powder (Ag:Pd=7:3 (mass ratio)) and 3 mass % of piezoelectric/electrostrictive porcelain composition (with the proviso that the total of Ag—Pd alloy powder and the piezoelectric/ electrostrictive porcelain composition=100 mass %) was printed in a predetermined shape by a screen printing method. It is to be noted that the first electrode material was printed so that a thickness $T_1$ (see FIG. 1) of the formed first electrode layer was 5.0 μm after the firing. Next, on the printed first electrode material, a pasted second electrode material containing Ag—Pd alloy powder (Ag:Pd=7:3 (mass ratio)) was printed in a predetermined shape by the screen printing method. It is to be noted that the second electrode material was printed so that a thickness $T_2$ (see FIG. 1) of the formed second electrode layer was 5.0 μm after the firing. Moreover, the material was printed so that a dimensional difference D (see FIG. 2) between the arrangement region of the first electrode layer and the arrangement region of the second electrode layer was 20 μm.

The printed green sheets for 30 layers were laminated to prepare a laminated substrate 4 including 100 (=20×5) product portions 5 as shown in FIG. 12. A height $H_1$ of the resultant laminated substrate was 1.28 mm, a length $L_1$ of the laminated substrate was 100 mm, and a width $W_1$ of the laminated substrate was 100 mm. After firing the resultant laminated substrate at 900° C. in an electric furnace, the substrate was divided to cut out 100 product portions 5. Side electrodes were disposed by using a pasted side electrode material containing Ag—Pd alloy powder (Ag:Pd=7:3 (mass ratio)) on side surface portions of the cutout product portions 5 to manufacture 100 piezoelectric/electrostrictive elements 20 as shown in FIG. 13A. A height $H_2$ of the manufactured piezoelectric/electrostrictive element was 1.2 mm, a length $L_2$ of the piezoelectric/electrostrictive element was 5.0 mm, and a width $W_2$ of the piezoelectric/electrostrictive element was 2.0 mm.

A probe pin was pressed onto the surface of an external terminal electrode of the manufactured piezoelectric/electrostrictive element, to measure a capacitance with an LCR meter. The element usually having a capacitance of several tens of nF but actually having a capacitance of about 0 nF was noted by 'an open defect', and a measurement defect occurrence ratio was calculated (with the proviso that the element actually having a capacitance of 1 nF or less was noted by 'the open defect'). The measurement defect occurrence ratio was 0%.

Examples 2 to 8, Comparative Examples 1 to 10

Figure 8:
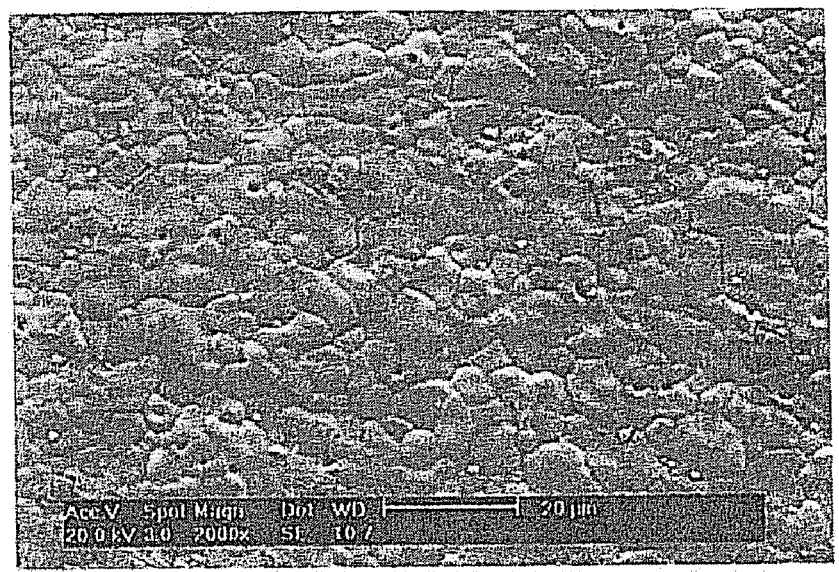
FIG. 8 is an electron microscope photograph of the surface of an external terminal electrode of a piezoelectric/electrostrictive element obtained in Example 3.
Figure 9:
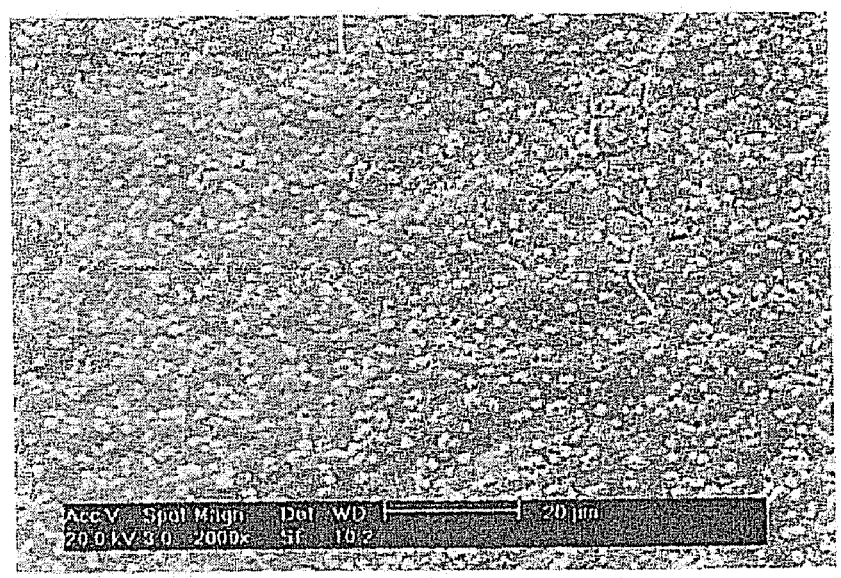
FIG. 9 is an electron microscope photograph of the surface of an external terminal electrode of a piezoelectric/electrostrictive element obtained in Comparative Example 4.

Piezoelectric/electrostrictive elements were manufactured in the same manner as in Example 1 except that piezoelectric/electrostrictive porcelain compositions were contained in electrode materials at ratios shown in Table 2 and that formed external terminal electrodes had structures shown in Table 2. The calculation results of the measurement defect occurrence ratios of manufactured piezoelectric/electrostrictive elements are shown in Table 2. The electron microscope photographs of the surfaces of the external terminal electrodes of the piezoelectric/electrostrictive elements obtained in Example 3 and Comparative Example 4 are shown in FIGS. 8 and 9, respectively. It is apparent from the electron microscope photographs shown in FIGS. 8 and 9 that the piezoelectric/electrostrictive porcelain composition is deposited as white particles on the surface of the external terminal electrode of the piezoelectric/electrostrictive element obtained in Comparative Example 4, whereas any white particle is not deposited on the surface of the external terminal electrode of the piezoelectric/electrostrictive element obtained in Example 3.

TABLE 2

| | Metal component contained in electrode material*[1] | Structure of external terminal electrode | Ratio of piezoelectric/ electrostrictive material contained in electrode material*[2] (mass %) | Measurement defect occurrence ratio (%) |
|---|---|---|---|---|
| Comp. Ex. 1 | Ag—Pd alloy powder(Ag:Pd = 7:3) | 1-layer structure | 0 | 0 |
| Comp. Ex. 2 | Ag—Pd alloy powder(Ag:Pd = 7:3) | 1-layer structure | 3 | 85 |
| Comp. Ex. 3 | Ag—Pd alloy powder(Ag:Pd = 7:3) | 1-layer structure | 10 | 95 |
| Comp. Ex. 4 | Ag—Pd alloy powder(Ag:Pd = 7:3) | 1-layer structure | 20 | 100 |
| Comp. Ex. 5 | Ag—Pd alloy powder(Ag:Pd = 7:3) | 1-layer structure | 50 | 100 |
| Comp. Ex. 6 | Ag—Pd alloy powder(Ag:Pd = 8:2) | 1-layer structure | 20 | 100 |
| Comp. Ex. 7 | Ag—Pd alloy powder(Ag:Pd = 9:1) | 1-layer structure | 20 | 100 |
| Comp. Ex. 8 | Ag—Pd alloy powder(Ag:Pt = 8:2) | 1-layer structure | 20 | 100 |
| Comp. Ex. 9 | Pt | 1-layer structure | 20 | 100 |
| Comp. Ex. 10 | Ag—Pd alloy powder(Ag:Pd = 7:3) | 2-layer structure | 0 | 0 |
| Ex. 1 | Ag—Pd alloy powder(Ag:Pd = 7:3) | 2-layer structure | 3 | 0 |
| Ex. 2 | Ag—Pd alloy powder(Ag:Pd = 7:3) | 2-layer structure | 10 | 0 |
| Ex. 3 | Ag—Pd alloy powder(Ag:Pd = 7:3) | 2-layer structure | 20 | 0 |
| Ex. 4 | Ag—Pd alloy powder(Ag:Pd = 7:3) | 2-layer structure | 50 | 0 |
| Ex. 5 | Ag—Pd alloy powder(Ag:Pd = 8:2) | 2-layer structure | 20 | 0 |
| Ex. 6 | Ag—Pd alloy powder(Ag:Pd = 9:1) | 2-layer structure | 20 | 0 |
| Ex. 7 | Ag—Pd alloy powder(Ag:Pt = 8:2) | 2-layer structure | 20 | 0 |
| Ex. 8 | Pt | 2-layer structure | 20 | 0 |

*[1]The ratio in parentheses indicates 'a mass ratio'.
*[2]In Examples 1 to 8 and Comparative Example 10, the ration (mass %) of the piezoelectric/electrostrictive material contained in the first electrode material is shown.

INDUSTRIAL APPLICABILITY

A piezoelectric/electrostrictive element of the present invention is suitable as an ultrasonic motor, a piezoelectric transformer, a sound generator, an actuator, a sensor or the like.

The invention claimed is:

1. A piezoelectric/electrostrictive element comprising:
a piezoelectric/electrostrictive drive unit possessing a piezoelectric/electrostrictive body made of a piezoelectric/electrostrictive material; and
a film external terminal electrode which is disposed on at least one surface of the piezoelectric/electrostrictive body and which substantially does not contain a glass component,
wherein the external terminal electrode is an electrode having a laminated structure comprising a first electrode layer disposed to contact the piezoelectric/electrostrictive body closely and made of a first electrode material which contains a first metal component as well as the piezoelectric/electrostrictive material and a second electrode layer disposed on the first electrode layer and made of a second electrode material which contains a second metal component and substantially does not contain the piezoelectric/electrostrictive material, and
the first metal component and the second metal component contain the same metal elements.

2. The piezoelectric/electrostrictive element according to claim 1, wherein the arrangement region of the second electrode layer is smaller than that of the first electrode layer.

3. The piezoelectric/electrostrictive element according to claim 2, wherein the piezoelectric/electrostrictive drive unit further possesses internal electrodes made of an electrode material for the internal electrodes, and is a laminated body in which the piezoelectric/electrostrictive body and the internal electrodes are alternately laminated, and wherein
the electrode material for the internal electrodes contains a third metal component whereby the third metal component contains the same metal elements as that of the first and second metal components.

4. The piezoelectric/electrostrictive element according to claim 3, wherein the piezoelectric/electrostrictive drive unit is a columnar laminated body, and further possesses side electrodes disposed on the side surfaces of the drive unit to electrically connect the external terminal electrodes to the internal electrodes.

5. The piezoelectric/electrostrictive element according to claim 1, wherein the piezoelectric/electrostrictive drive unit further possesses internal electrodes made of an electrode material for the internal electrodes, and is a laminated body in which the piezoelectric/electrostrictive body and the internal electrodes are alternately laminated, and wherein
the electrode material for the internal electrodes contains a third metal component whereby the third metal component contains the same metal elements as that of the first and second metal components.

6. The piezoelectric/electrostrictive element according to claim 5, wherein the piezoelectric/electrostrictive drive unit is a columnar laminated body, and further possesses side electrodes disposed on the side surfaces of the drive unit to electrically connect the external terminal electrodes to the internal electrodes.

7. The piezoelectric/electrostrictive element according to claim 1, wherein the piezoelectric/electrostrictive material is a lead-zirconate-titanate-based piezoelectric/electrostrictive porcelain composition.

8. The piezoelectric/electrostrictive element according to claim 7, wherein the piezoelectric/electrostrictive porcelain composition contains 65 to 70 mass % of Pb in terms of PbO, 7.0 to 16.0 mass % of Ti in terms of $TiO_2$, 10.5 to 24.5 mass % of Zr in terms of $ZrO_2$, 0.65 to 1.05 mass % of Sb in terms of $Sb_2O_3$, 0.5 to 0.8 mass % of Nb in terms of $Nb_2O_5$, 0.3 to 0.7 mass % of Cu in terms of CuO, 0.6 to 1.5 mass % of W in terms of $WO_3$ and 0.3 to 0.7 mass % of Mn in terms of $MnO_2$, and a molar content ratio between Cu and W is in a range of 1.5:1 to 2.5:1.

9. The piezoelectric/electrostrictive element according to claim 1, wherein the first metal component and the second metal component contain Ag, Pd, Pt, Au or an alloy of them as a main component.

10. The piezoelectric/electrostrictive element according to claim 9, wherein the first metal component contains 60 to 90 mass % of Ag and 10 to 40 mass % of Pd, with the proviso that Ag+Pd =100 mass %, and
the content ratio of the piezoelectric/electrostrictive material with respect to the total of the first metal component and the piezoelectric/electrostrictive material is in a range of 10 to 50 vol %.

11. The piezoelectric/electrostrictive element according to claim 9, wherein the second metal component contains 60 to 90 mass % of Ag and 10 to 40 mass % of Pd, with the proviso that Ag+Pd =100 mass %.

12. The piezoelectric/electrostrictive element according to claim 10, wherein the second metal component contains 60 to 90 mass % of Ag and 10 to 40 mass % of Pd, with the proviso that Ag+Pd =100 mass %.

13. A method for manufacturing the piezoelectric/electrostrictive element according to claim 1, comprising:
a step of disposing, on the surface of a piezoelectric/electrostrictive precursor, a first electrode material containing a first metal component and a piezoelectric/electrostrictive material in the form of a film to form a first electrode layer precursor;
a step of disposing, on the first electrode layer precursor, a second electrode material which contains a second metal component containing the same metal elements as that of the first metal component and which substantially does not contain the piezoelectric/electrostrictive material in the form of a film to form a second electrode layer precursor; and
a step of integrally firing the piezoelectric/electrostrictive precursor, the first electrode layer precursor and the second electrode layer precursor to dispose, on the surface of a piezoelectric/electrostrictive body, a film external terminal electrode which has a laminated structure comprising a first electrode layer disposed to contact the piezoelectric/electrostrictive body closely and a second electrode layer disposed on the first electrode layer and which substantially does not contain a glass component.

* * * * *